United States Patent
Hosseinzadeh-Shanjani et al.

(10) Patent No.: US 9,590,666 B2
(45) Date of Patent: *Mar. 7, 2017

(54) TRANSMIT NOISE AND IMPEDANCE CHANGE MITIGATION IN WIRED COMMUNICATION SYSTEM

(71) Applicant: Entropic Communications, LLC, Carlsbad, CA (US)

(72) Inventors: Payman Hosseinzadeh-Shanjani, San Diego, CA (US); Branislav Petrovic, La Jolla, CA (US)

(73) Assignee: ENTROPIC COMMUNICATIONS, LLC, Carlsbad, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/810,781

(22) Filed: Jul. 28, 2015

(65) Prior Publication Data
US 2015/0349817 A1 Dec. 3, 2015

Related U.S. Application Data

(63) Continuation of application No. 14/052,399, filed on Oct. 11, 2013, now Pat. No. 9,094,068.

(51) Int. Cl.
*H03K 17/16* (2006.01)
*H04B 1/04* (2006.01)
*H04B 3/04* (2006.01)
*H03K 19/00* (2006.01)

(52) U.S. Cl.
CPC ........... *H04B 1/0475* (2013.01); *H04B 3/04* (2013.01); *H03K 19/0005* (2013.01); *H04B 2001/0408* (2013.01)

(58) Field of Classification Search
CPC .................. H03K 19/0005; H04B 1/0475
USPC .............................. 326/21, 30, 82
See application file for complete search history.

(56) References Cited

U.S. PATENT DOCUMENTS

| | | | |
|---|---|---|---|
| 4,703,284 A | 10/1987 | Barbu | |
| 5,274,671 A | 12/1993 | Johnson | |
| 6,310,489 B1 | 10/2001 | Yuan et al. | |
| 6,490,727 B1 | 12/2002 | Nazarathy et al. | |
| 2002/0125956 A1 | 9/2002 | Joseph | |

(Continued)

OTHER PUBLICATIONS

International Search Report dated Jan. 26, 2015 for PCT Patent Application No. PCT/US2014/060035.

(Continued)

*Primary Examiner* — Don Le
(74) *Attorney, Agent, or Firm* — McAndrews, Held & Malloy, Ltd.

(57) ABSTRACT

Methods and systems are provided for mitigating noise and/or impedance effects in transmitters. The mitigation comprises, when transmitter is in a non-active mode, decoupling at least a portion of the transmitter and coupling an auxiliary component to a remaining portion of the transmitter. When the transmitter is in an active mode, the auxiliary component is decoupled from the remaining portion of the transmitter, and the at least a portion of the transmitter is coupled to the remaining portion of the transmitter. The auxiliary component comprises one or more of: a resistive element, a capacitive element, and a reactive component. The auxiliary component is configured such that it may achieve a small mismatching error.

18 Claims, 3 Drawing Sheets

(56) References Cited

U.S. PATENT DOCUMENTS

| | | | |
|---|---|---|---|
| 2003/0124989 A1* | 7/2003 | Kwon | H03K 19/018521 455/88 |
| 2007/0247185 A1 | 10/2007 | Oie et al. | |
| 2008/0030221 A1 | 2/2008 | Lee et al. | |
| 2008/0272800 A1 | 11/2008 | Haig et al. | |
| 2010/0013516 A1* | 1/2010 | Kyung | G11C 7/1072 326/30 |
| 2010/0237901 A1 | 9/2010 | Lee | |
| 2012/0182044 A1* | 7/2012 | Oh | G11C 5/063 326/30 |
| 2013/0127526 A1 | 5/2013 | Sayuk | |

OTHER PUBLICATIONS

International Preliminary Report dated Apr. 21, 2016 for PCT Patent Application No. PCT/US2014/060035.

* cited by examiner

TRANSMIT NOISE AND IMPEDANCE CHANGE MITIGATION IN WIRED COMMUNICATION SYSTEM

CLAIM OF PRIORITY

This application is a continuation of U.S. patent application Ser. No. 14/052,399 filed Oct. 11, 2013. The above application is hereby incorporated herein by reference in its entirety.

BACKGROUND

In a network, impedance change or Return Loss (RL) change of one or more nodes while another node is transmitting or receiving may cause interference. This is because a signal propagating through the network is a composite of all reflections of all nodes. Therefore, if any reflected signal component changes, the composite will also change, affecting reception or transmission. This is shown in FIG. 1, which depicts multiple Customer Premises Equipment (CPEs), or nodes 10, 10', 10", in a network (of coaxial cables 16 and taps 15, 15' and 15" connecting CPE units and Network Controller (NC 14)). Single port taps are shown for simplicity, but often multiport taps are used in a typical CATV plant showing the effects of adjacent nodes return loss change. As shown in FIG. 1, the signal propagating to network controller (NC) 14 includes direct path data signal 12 and reflections 18 from nodes 10' and 10". If the impedance of any of the nodes 10' or 10" changes, the reflections will change and consequently the received signal at NC 14 will change. Depending on isolation of nodes and the amount of RL change, the effect can degrade the link, cause packet errors, and in some cases may disable communications.

For the above reasons, as taught in the prior art, all the nodes are always kept in the same state (in the transmit mode with unchanged output impedance) all the time, no matter if they are actively transmitting or not. When not transmitting any data or intended content, but ready to transmit data at any moment, this is referred to as a "transmit-ready" or "mute" state.

However, aggregate noise power of all the mute nodes while another node is transmitting will degrade the sensitivity of the receiver or NC 14 to the actively transmitting node. Alternatively, in the prior art an opposite choice is made by turning the transmitters off, so that noise is eliminated, but at the expense of significant impedance/return loss changes, and increased delay in turning the transmitters back on.

Clearly, achieving both low noise and unchanged impedance is advantageous, and that is the objective of the claimed embodiments.

SUMMARY

In the claimed embodiments, part or all of a transmitter, when it is in mute mode (not actively transmitting), will be turned off, removed or modified in general in order to reduce the total noise submitted by the transmitter to the transmission line. In parallel, an auxiliary circuit or impedance will be added to the transmitter in order to mitigate the total return loss change of the transmitter. When in active transmitter mode, this auxiliary circuit or impedance will be removed from the transmitter, and transmitter will transmit in normal mode.

BRIEF DESCRIPTION OF THE DRAWINGS

The disclosed method, system, and apparatus, in accordance with one or more various embodiments, are described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

The claimed embodiments herein solve the problems stated above. In the claimed method, system, and circuit, part or all of the transmitter, when it's in mute mode (not actively transmitting), will be turned off, removed or modified in general in order to reduce the total noise submitted by the transmitter to the transmission line.

In parallel, an auxiliary circuit or impedance will be added to the transmitter in order to mitigate the total return loss change of the transmitter. The term impedance is defined as having a resistive component, and/or a capacitive component, and/or an inductive component, and/or a reactive component.

Figure 1:
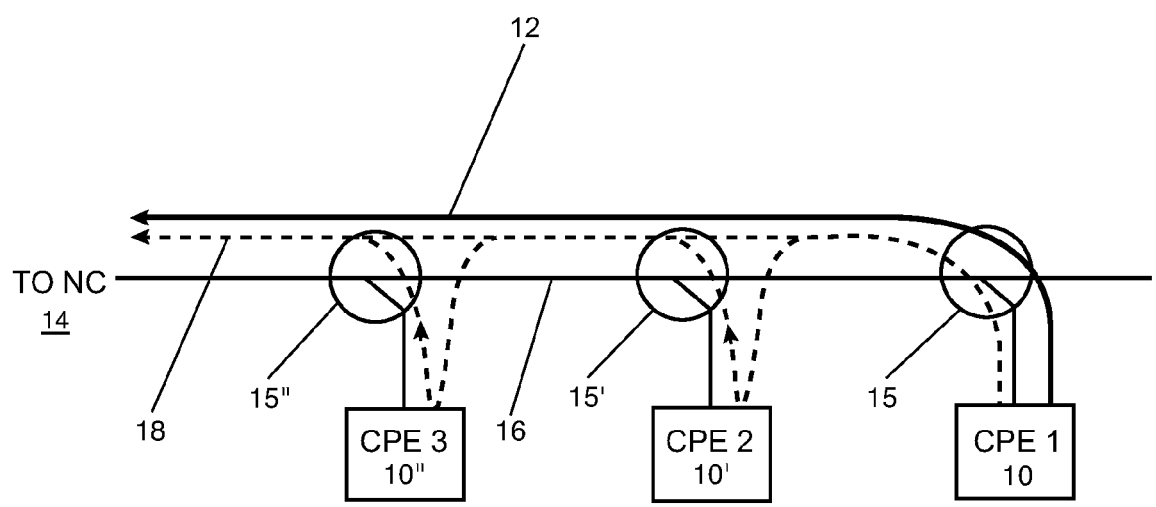
FIG. 1 is an illustration of the effects of adjacent nodes return loss changes.
Figure 2:
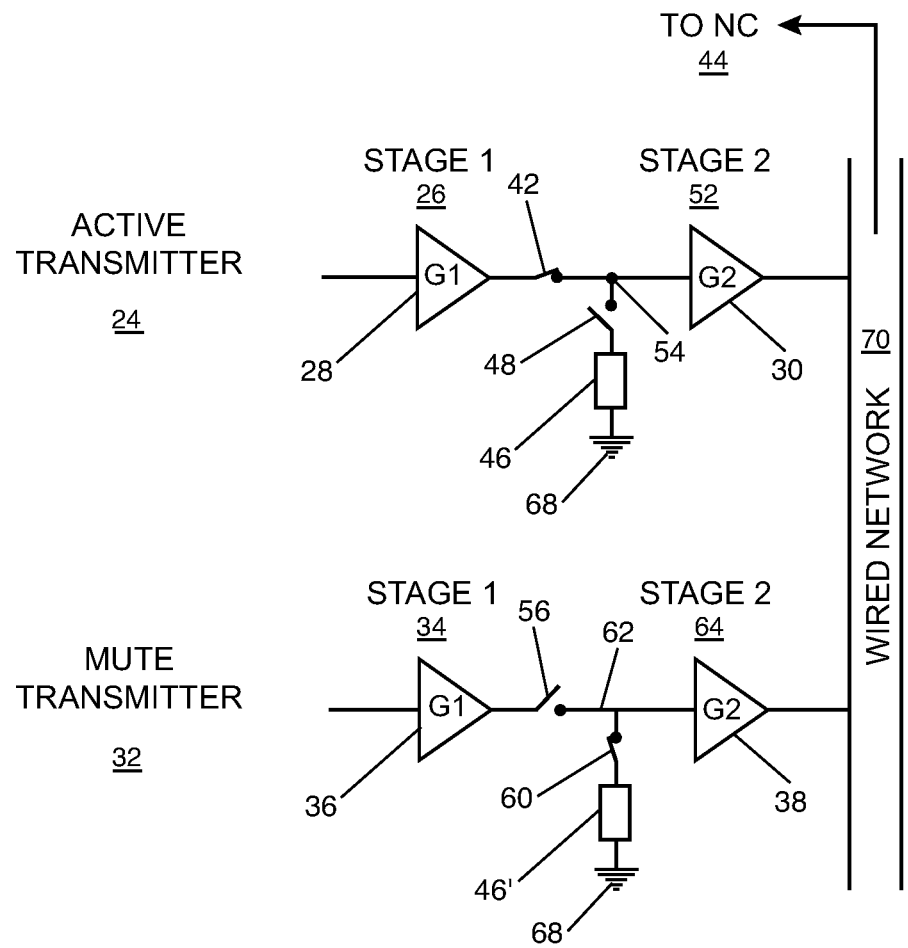
FIG. 2 illustrates an active transmitter and a mute transmitter containing the preferred embodiment
Figure 3:
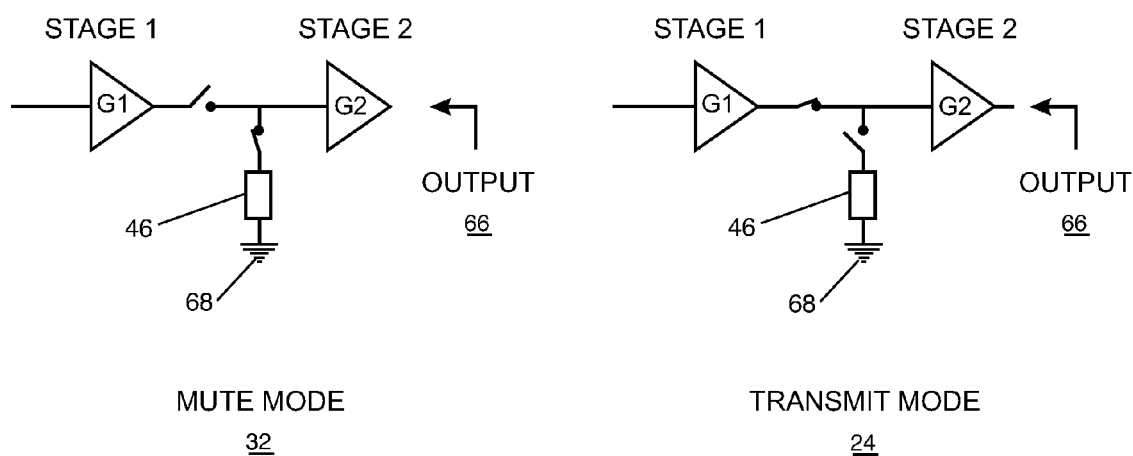
FIG. 3 illustrates the preferred embodiment on a single transmitter in the active and mute state.

When in active transmit mode, this auxiliary circuit or impedance will be removed from the transmitter and transmitter will transmit in normal mode. Muting of the non-active transmitter and the addition or removal of the impedance component can be achieved by hardware switches, software, and firmware or by any other method well known in the art. The preferred embodiments are shown in FIGS. 2 and 3. FIG. 2 shows two nodes, active transmitter 24 and mute transmitter 32. Although the figure shows two transmitters, this disclosure is intended to include any number of transmitters with each transmitter in one of the two modes. First node 24, in this figure the active transmitter, has at least two stages, stage 1 26 comprising a first stage amplifier 28 and stage 2 52 comprising second stage amplifier 30. Second node 32, in this figure mute transmitter, has at least two stages, stage 1 34 comprising first stage amplifier 36 and stage 2 64 comprising second stage amplifier 38. Again, although two stages are shown, this disclosure is intended to include any number of stages as required by the intended use. As shown in the figure, active transmitter 24 (in an active state) is coupled by switch 42 between first stage amplifier 28 and second stage amplifier 30. As previously indicated the coupling can be provided in any manner well known in the art. This provides for a clear path over wired network 70 to network controller (NC) 44. Simultaneously, compensation impedance 46 via an auxiliary circuit, or the like is decoupled by the switch 48 from connecting line 54 between first stage amplifier 28 and second stage amplifier 30 with the second end of compensation impedance 46 coupled to ground 68.

Mute transmitter 32 functions similarly to active transmitter; however, in an opposite state. Second node, in this figure mute transmitter 32, has at least two stages, stage 1 34 comprising a first stage amplifier 36 and stage 2 64 comprising second stage amplifier 38. Again, although two stages are shown, this disclosure is intended to include any number of stages as required by the intended use. As shown in the figure, mute transmitter 32 (in an inactive state) is decoupled by the switch 56 between first stage amplifier 36 and second stage amplifier 38. As previously indicated, the coupling can be provided in any manner well known in the art. This provides for a decoupled path to Network Controller (NC) 44. Simultaneously, compensation impedance 46' is coupled by switch 60 to connecting line 62 between first stage amplifier 36 and second stage amplifier 38. The other end of compensation impedance 46' is coupled to ground 68.

With the disclosed method, the noise injected into the line when transmitter is in the mute mode will be reduced approximately by the gain of the first amplifier G1. The output noise with the traditional solution is approximately NF1+G1+G2−output loss, whereas with the present method it is only NF2+G2−output loss. For example, if NF1=NF2=5 dB, G1=20 dB, G2=10 dB, output loss=3 dB, then, with traditional solution, Output noise=5+20+10−3=32 dB (above thermal noise floor). However, with the present method, Output noise=5+10−3=12 dB, i.e. a 20 dB improvement.

FIG. 3 shows a similar embodiment of FIG. 2; however, this embodiment shows a same transmitter, first in a mute mode 32 and a transition of the transmitter to an active mode 24. In FIG. 3, impedance Z 46 is passive in a preferred embodiment to minimize noise contributions. Impedance Z 46 is designed to mimic (and substitute for) the output impedance of the first amplifier (G1) as close as possible in the frequency range of interest. The goal is to minimize the impedance change upon switchover from the amplifier to Z, thus, minimizing the change of output 66. While in the mute mode, the first amplifier can be powered off if it is desirable to save the power, but it must be turned on in time to settle and be ready for next transmission. The switchover time of the switches should be fast so that any transient while the switch changes its impedance from short to open and vice versa is out of band, and does not cause any perceivable glitch. Typically the switchover time is in the sub-nanosecond range, fast enough so the transient is well out of band. The output impedance of the first amplifier can be determined by circuit simulation, or measurement if feasible. This impedance is then the target for mimicking (over frequency of interest) by impedance Z 46, which is synthesized by passive components, in general, a combination of resistor(s), capacitor(s), and inductor(s). In some embodiments, active circuits may be added to facilitate the approximation, provided their noise contribution is low enough to be acceptable.

In one embodiment impedance Z 46 consists of a resistor only, providing a first-order match to the first amplifier's output impedance. In another embodiment, a C and L are added to the resistor, to achieve a closer approximation. In general, a higher order circuit for impedance Z 46 can be synthesized achieving arbitrarily small mismatching errors.

The following presents a simplified summary of one or more embodiments in order to provide a basic understanding of some aspects of such embodiments. This summary is not an extensive overview of the one or more embodiments, and is intended to neither identify key or critical elements of the embodiments nor delineate the scope of such embodiments. Its sole purpose is to present some concepts of the described embodiments in a simplified form as a prelude to the more detailed description that is presented later.

While various embodiments of the disclosed method and apparatus have been described above, it should be understood that they have been presented by way of example only, and should not limit the claimed invention. Likewise, the various diagrams may depict an example architectural or other configuration for the disclosed method and apparatus. This is done to aid in understanding the features and functionality that can be included in the disclosed method and apparatus. The claimed invention is not restricted to the illustrated example architectures or configurations, rather the desired features can be implemented using a variety of alternative architectures and configurations. Indeed, it will be apparent to one of skill in the art how alternative functional, logical or physical partitioning and configurations can be implemented to implement the desired features of the disclosed method and apparatus. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed method and apparatus is described above in terms of various exemplary embodiments and implementations, it should be understood that the various features, aspects and functionality described in one or more of the individual embodiments are not limited in their applicability to the particular embodiment with which they are described. Thus, the breadth and scope of the claimed invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed:

1. A method comprising:
  mitigating one or both of transmit noise and impedance effects in a transmitter, the mitigating comprising, in a non-active mode:
    decoupling at least a portion of said transmitter; and
    coupling an auxiliary component to a remaining portion of said transmitter.

2. The method of claim 1, comprising configuring the auxiliary component to mimic one or more characteristics of at least one element of said at least portion of said transmitter.

3. The method of claim 2, wherein said at least one element of said at least portion of said transmitter comprise an amplifier, and said one or more characteristics comprise an impedance of said amplifier.

4. The method of claim 3, wherein said one or more characteristics comprise an impedance of said amplifier.

5. The method of claim 1, wherein said auxiliary component comprises one or more of: a resistive element, a capacitive element, and a reactive component.

6. The method of claim 1, comprising configuring said auxiliary component based on a frequency range.

7. The method of claim 1, comprising configuring said auxiliary component based on data obtained by simulation or by measurement.

8. The method of claim 1, comprising configuring the auxiliary component to achieve a small mismatching error.

9. The method of claim 1, comprising, in a non-active mode:
  decoupling said auxiliary component from said remaining portion of said transmitter; and
  coupling said at least a portion of said transmitter to said remaining portion of said transmitter.

10. A system, comprising:
  a transmit path comprising one or more circuits;
  an auxiliary circuit;
  one or more switch elements connecting said auxiliary circuit to said transmit path;
  wherein said one or more switch elements are operable to, in a non-active mode:
    decouple at least a portion of said transmit path; and
    couple said auxiliary circuit to a remaining portion of said transmit path.

11. The system of claim 10, wherein said auxiliary circuit is operable to mimic one or more characteristics of at least one element of said at least portion of said transmit path.

12. The system of claim 11, wherein said at least one element of said at least portion of said transmit path comprises an amplifier circuit.

13. The system of claim 12, wherein said one or more characteristics comprise an impedance of said amplifier circuit.

14. The system of claim 10, wherein said auxiliary circuit comprises one or more of: a resistive element, a capacitive element, and a reactive component.

15. The system of claim 10, wherein said auxiliary circuit is configured based on a frequency range.

16. The system of claim 10, wherein said auxiliary circuit is configured based on data obtained by simulation or by measurement.

17. The system of claim 10, wherein said auxiliary circuit is operable to achieve a small mismatching error.

18. The system of claim 10, wherein said one or more switch elements are operable to, in a non-active mode:
  decouple said auxiliary component from said remaining portion of said transmit path; and
  couple said at least a portion of said transmit path to said remaining portion of said transmit path.

* * * * *